United States Patent
Noda

(10) Patent No.: US 6,583,870 B2
(45) Date of Patent: Jun. 24, 2003

(54) SIMULATED DEFECTIVE WAFER AND PATTERN DEFECT INSPECTION RECIPE PREPARING METHOD

(75) Inventor: Tomonobu Noda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/865,701

(22) Filed: May 29, 2001

(65) Prior Publication Data

US 2002/0006497 A1 Jan. 17, 2002

(30) Foreign Application Priority Data

May 30, 2000 (JP) ........................................ 2000-160506

(51) Int. Cl.[7] .............................................. G01N 21/00
(52) U.S. Cl. ................................................... 356/237.5
(58) Field of Search ...................... 438/14, 48; 328/145; 356/432, 632, 430, 237; 364/578

(56) References Cited

U.S. PATENT DOCUMENTS 5,453,830 A * 9/1995 Greed, Jr. .................... 356/243
5,886,909 A * 3/1999 Milor ........................... 364/578

FOREIGN PATENT DOCUMENTS

JP 10-325807 12/1998

OTHER PUBLICATIONS

D Kahng, T.A. Shankoff, T.T. Sheng and S.E. Haszko; "A Method for Area Saving Palnar Isolation Oxides Using Oxidation Protected Sidewalls", Nov. 1980, J Electrochem. Soc.: Solid State Sceince and Technology; p 2468–2471.*

* cited by examiner

Primary Examiner—John F. Niebling
Assistant Examiner—Charlie C Stevenson
(74) Attorney, Agent, or Firm—Oblon, Spivak, McClelland, Maier & Neustadt, P.C.

(57) ABSTRACT

A provisional inspection recipe is prepared using a simulated defective wafer having a simulated defect layer which has the variations in height and plane shape with respect to a simulated normal layer. An actual defect inspection for the simulated defective wafer is carried out by means of a defect inspection system to compare a detected defect data with a previously obtained simulated defect data of the simulated defective wafer to quantify a defect detection sensitivity. The provisional inspection recipe is modified while changing tentative recipe parameters until a desired defect detection ratio is obtained. When the desired defect detection ratio is obtained, the tentative recipe parameters at the time are decided as recipe parameters adaptive for the defect inspection system.

20 Claims, 9 Drawing Sheets

SIMULATED DEFECTIVE WAFER AND PATTERN DEFECT INSPECTION RECIPE PREPARING METHOD

CROSS REFERENCE TO RELATED APPLICATION

This application claims benefit of priority under 35 USC §119 to Japanese patent application No.2000-160506, filed on May 30, 2000, the contents of which are incorporated by reference herein.

BACKGROUND OF THE INVENTION

1. Field of the Invention

The present invention relates generally to a semiconductor pattern defect inspection. More specifically, the invention relates to a simulated defective wafer and a pattern defect inspection recipe preparing method for use in a semiconductor pattern defect inspection.

2. Description of the Prior Art

Referring to the flow chart of FIG. 14, an example of a conventional pattern defect inspection recipe preparing method will be described below.

First, a wafer serving as an object to be inspected is prepared (step S91). Then, tentative parameters for recipe are selected (step S92) to prepare a provisional inspection recipe (step S93). Then, the wafer serving as the object to be inspected is actually inspected to observe a detected defect (step S94). On the basis of the kind of the defect (which will be hereinafter referred to as a "defect kind") and the size of the defect, it is determined whether a defect detection sensitivity based on the provisional inspection recipe reaches a desired detection sensitivity (step S95). If it is not determined that the defect detection sensitivity reaches the desired detection sensitivity, a series of procedures including the selection of recipe parameters, the preparation of a provisional inspection recipe, the inspection of the wafer and the observation of defects are repeated (steps S92 through S95). If it is determined that the defect detection sensitivity reaches the desired detection sensitivity, finally selected recipe parameters are decided as recipe parameters suitable for inspection (step S96), and the provisional inspection recipe at that time is registered with a defect inspection system as a defect inspection recipe (step S97) to end the preparation of the inspection recipe.

However, in the above described conventional inspection recipe preparing method, there are the following problems.

That is, since the wafer serving as an object to be inspected is an actual semiconductor product or TEG (Test Element Group), it is not possible to previously obtain defect information on what kinds of defects and how many defects actually exist. Therefore, it is not possible to determine whether all of defect kinds to be detected have actually been detected, namely, whether other defect kinds can not be detected or no pattern defect exists. In addition, there is also a problem in that the quality of an inspection recipe is influenced by the level of skill of a person who prepares the inspection recipe.

Furthermore, when a simulated defect wafer, not an actual wafer, is intended to be used, a conventional simulated defect wafer in a monolayer structure is only prepared. For that reason, it is only possible to prepare a defect kind of a flat layer as simulated defects 101 and 102 shown in FIG. 15. However, as shown in FIG. 16, many actual defects are formed at various positions in vertical directions (in directions perpendicular to the surface of the substrate), such as a defect 103 formed on a patterned layer and a defect 104 formed in a gap between patterned layers on a substrate. It is difficult to realize such defects by a simulated defect wafer in a monolayer structure.

SUMMARY OF THE INVENTION

It is therefore a first object of the present invention to provide a simulated defective wafer for a defect inspection in view of various defect kinds.

It is a second object of the present invention to provide an inspection recipe preparing method capable of detecting a desired defect kind without omission independent of the level of skill of a person who prepares an inspection recipe.

According to a first aspect of the present invention, there is provided a simulated defective wafer comprising: a simulated normal layer which is formed on a semiconductor substrate so that the height of the top face of the simulated normal layer from the surface of the semiconductor substrate is a first height; and a first simulated defect layer which is formed on the semiconductor substrate so that the height of the top face of the first simulated defect layer from the surface of the semiconductor substrate is a second height which is different from the first height.

Since the first simulated defect layer is formed so that the height of the top face thereof is the second height which is different from the first height of the top face of the simulated normal layer from the surface of a semiconductor substrate, there is provided a simulated defective wafer capable of simulatively realizing defect layers, which are arranged at different positions in vertical directions, among actually possible defect layers. The simulated normal layer means a patterned layer wherein a pattern which is finely formed according to its design on a semiconductor wafer serving as an object to be inspected is simulatively formed on the simulated defective wafer.

The simulated defective wafer may preferably further comprise a second simulated defect layer which is formed on the semiconductor substrate so as to have a different plane shape from that of the simulated normal layer. By the second simulated defect layer, it is also possible to realize a defect kind in a plane shape.

The first simulated defect layer may preferably include a layer formed on the simulated normal layer. There is thus provided a simulated defective wafer wherein a typical defect kind which can appear on a wafer serving as an object to be inspected is simulatively realized.

In addition, the simulated normal layer, the first simulated defect layer and the second simulated defect layer may be constituted in a stacked layer which includes a conductive film respectively. Thus, there is provided a simulated defective wafer wherein a simulated defect is formed with an interconnection.

According to a second aspect of the invention, there is provided a method for preparing a defect inspection recipe for use in a semiconductor defect inspection system, the method comprising: a parameter setting step of setting a tentative recipe parameter; a first provisional recipe preparing step of preparing a first provisional defect inspection recipe on the basis of the recipe parameter; a simulated defect detecting step of detecting a defect of a simulated defective wafer using the first provisional pattern defect inspection recipe, a simulated defect data of the simulated defective wafer having previously been obtained, the simulated defect data being a data on a defect kind; a defect detection ratio calculating step of calculating a defect detection ratio of the first provisional pattern defect inspection recipe by comparing the detected defect data with the simulated defect data; a defect detection sensitivity determining step of determining a pattern defect detection sensitivity of the first provisional pattern defect inspection recipe by comparing the calculated pattern defect detection ratio with a desired pattern defect detection ratio; a first provisional recipe modifying step of repeating the first provisional recipe preparing step through the defect detection sensitivity determining step until the desired defect detection sensitivity is obtained while changing the tentative recipe parameter when the calculated defect detection ratio is lower than the desired defect detection ratio; and a recipe deciding step of deciding the recipe parameter at the time when the desired defect detection sensitivity is obtained, as a recipe parameter adaptive for the semiconductor defect inspection system.

According to the defect inspection recipe preparing method, the simulated defective wafer wherein a simulated defect data has been previously obtained is used, the detected defect data is compared with the simulated defect data to calculate the defect detection ratio based on the first provisional defect inspection recipe, so that it is possible to quantify the defect detection sensitivity of the first provisional defect inspection recipe. Moreover, it is possible to optimize recipe parameters by changing the tentative recipe parameters until the desired defection sensitivity. As a result, it is possible to prepare an appropriate defect inspection recipe independent of the level of skill of a person who prepares the recipe.

It is preferable that the above mentioned defect inspection recipe preparing method further comprises a second provisional recipe preparing step of preparing a second provisional defect inspection recipe using the decided recipe parameter; an actual inspection step of actually inspecting a defect of a semiconductor wafer as an object to be inspected using the second provisional defect inspection recipe;

an abnormality verification step of verifying whether the result of the defect inspection for the semiconductor wafer includes an abnormality; and a second provisional recipe modifying step of repeating the second provisional recipe preparing step through the abnormality verification step until the abnormality disappears while adjusting the decided recipe parameter, when the result of the defect inspection includes the abnormality.

Thus, the presence of abnormality in the results of the defect inspection for the semiconductor wafer serving as an object to be inspected is verified, and when there is an abnormality, the decided recipe parameters are adjusted until the abnormality disappears, so that it is possible to prepare a suitable defect inspection recipe.

It is advantageous that the defect inspection recipe preparing method further comprises a second provisional recipe preparing step of preparing a second provisional defect inspection recipe using the decided recipe parameter;

an actual inspection step of actually inspecting a defect of a semiconductor wafer as an object to be inspected using the second provisional recipe; an abnormality verification step of verifying whether the result of the defect inspection for the semiconductor wafer includes an abnormality; a step of determining the degree of the abnormality when the result of the detect inspection includes the abnormality; and, a final defect inspection recipe deciding step of classifying the determined degree of the abnormality to a first case where the determined degree of the abnormality is within a range in which the abnormality is removable by adjusting the second provisional defect inspection recipe and a second case where the determined degree of the abnormality is beyond the range in which the abnormality is removable by adjusting the second provisional defect inspection recipe and modifying the second provisional recipe in accordance with the result of the classification, wherein in the first case the second provisional recipe preparing step through the abnormality verification step are repeated while adjusting the decided recipe parameter until the abnormality disappears, and in the second case the first provisional recipe preparing step through the abnormality verification step are repeated while changing the tentative recipe parameter and the decided recipe parameter until the abnormality disappears.

Thus, when the degree of the abnormality is great, the tentative recipe parameters are set again at the first provisional recipe preparing step, so that it is possible to prepare the optimum defect inspection recipe.

The simulated defective wafer used in the defect inspection recipe preparing method may preferably the simulated defective wafer according to the present invention.

Thus, it is possible to choose the tentative recipe parameters in view of the kind of the defect layer arranged at the different vertical position from that of the simulated normal layer and/or the kind of a defect layer having a different shape from that of the simulated normal layer, so that it is possible to prepare a recipe file capable of carrying out a defect detection without omission.

In addition, the above mentioned recipe parameter may include the changeable focal length in the optical system or the electron optical system of the semiconductor defect inspection system, and it is preferable that the parameter setting step includes a step of setting the focal length corresponding to the defect kind which can exist at a predetermined position in directions perpendicular to the surface of the semiconductor wafer.

According to the prior art, when only a specific defect kind is inspected, a person who prepares a recipe presumes a focal length on the basis of his/her experience. Therefore, it is finally required that a data corresponding to a desired defect kind are extracted by a data processing, so that it takes a lot of time to carry out a data processing. According to the present invention, the feature of the defect kind and the defect detection sensitivity are thus quantified, so that an optimum recipe parameter for the desired defect kind can be chosen in a short time. Thus, there is provided a recipe file capable of greatly improving an inspection efficiency.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, some preferred embodiments of the present invention will be described below.

(1) Preferred Embodiment of Simulated Defective Wafer

Figure 1:
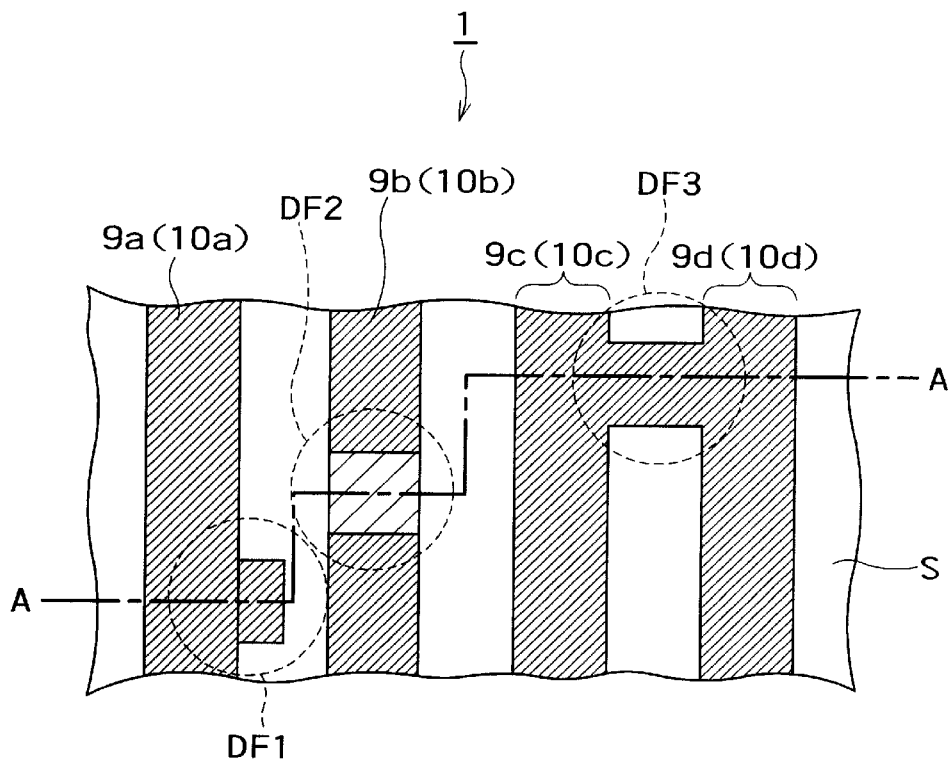
FIG. 1 is a part plan view showing a preferred embodiment of a simulated defective wafer according to the present invention.
Figure 2:
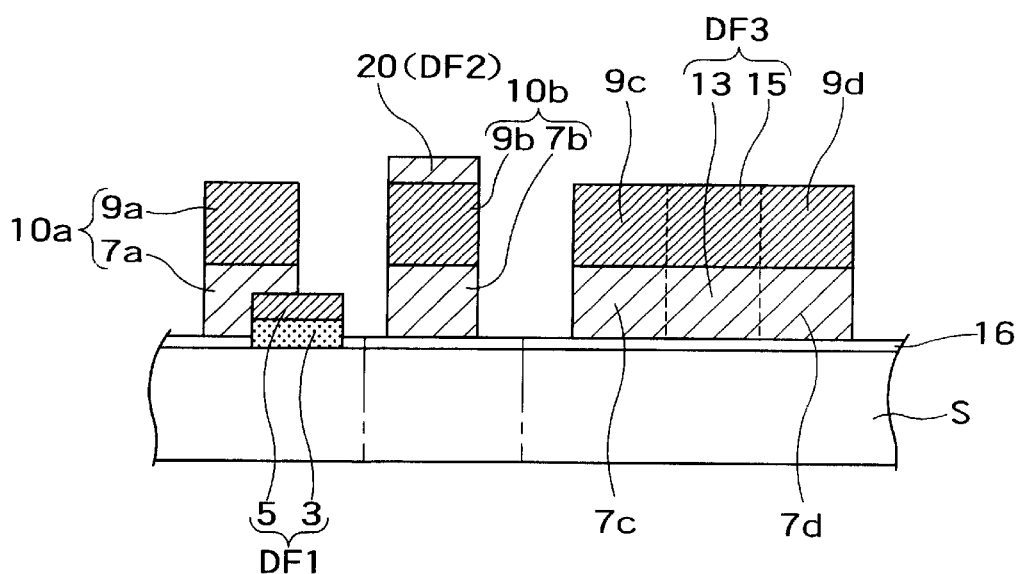
FIG. 2 is a schematic sectional view of the simulated defective wafer taken along line A—A of FIG. 1.

FIG. 1 is a part plan view showing a preferred embodiment of a simulated defective wafer according to the present invention, and FIG. 2 is a schematic sectional view of the simulated defective wafer taken along line A—A of FIG. 1.

As shown in FIGS. 1 and 2, the simulated defective wafer 1 in this preferred embodiment is adapted for use in a pattern defect inspection in a Gate wiring process. The simulated defective wafer 1 comprises interconnections 10a through 10d formed on a silicon substrate S and simulated defect layers DF1 through DF3.

The simulated defective wafer in this preferred embodiment is characterized in that the height of the top face of each of the simulated defect layers DF1 and DF2 from the surface of the substrate S is different from those of the interconnections 10a through 10d as shown in the sectional view of FIG. 2, and that the plane shape of each of the simulated defect layers DF1 through DF3 is different from those of the interconnections 10a through 10d as shown in FIG. 1.

The interconnections 10a through 10d include polysilicon films 7a through 7d which are deposited on a silicon oxide film 16 on the substrate S so as to have a thickness of about 200 nm, respectively, and silicon nitride films 9a through 9d which are deposited on the polysilicon films 7a through 7d so as to have a thickness of about 200 nm, respectively. The interconnections 10a through 10d are formed in linear patterns with a predetermined pitch in lateral directions in FIG. 1. The interconnections 10a through 10d are simulated normal layers in this preferred embodiment.

The simulated defect layer DF1 includes a silicon oxide film 3 which is deposited on the silicon substrate S so as to have a thickness of about 50 nm and a silicon nitride film 5 which is deposited on the silicon oxide film 3 so as to have a thickness of about 100 nm. The height of the top face of the silicon nitride film 5 from the surface of the substrate S is lower than those of the interconnections 10a through 10d. The simulated defect layer DF1 is formed so that a part of the silicon oxide film 3 and a part of the silicon nitride film 5 are embedded in the interconnection 10a and the residual portions thereof are arranged between the interconnections 10a and 10b.

The simulated defect layer DF2 includes a polysilicon film 20 which is deposited on a part of the interconnection 10b so as to have a thickness of about 100 nm. Thus, the height of the top face of the simulated defect layer DF2 from the surface of the substrate S is different from those of the interconnections 10a through 10d.

The simulated defect layer DF3 is formed so that a part of a gap between the interconnections 10c and 10d is filled with a material which is the same as those of the interconnections 10c and 10d so as to have the same thickness as those of the interconnections 10c and 10d. Therefore, the height of the top face of the simulated defect layer DF3 from the surface of the substrate S is the same as those of the wiring patterns 10c and 10d, and the simulated defect layer DF3 has such a shape that the interconnections 10c and 10d are connected to each other in a plane vision.

Since a defect inspection recipe preparing method using the simulated defective wafer 1 in this preferred embodiment will be described in the next preferred embodiment, a method for producing the simulated defective wafer 1 will be described below.

Figure 5:
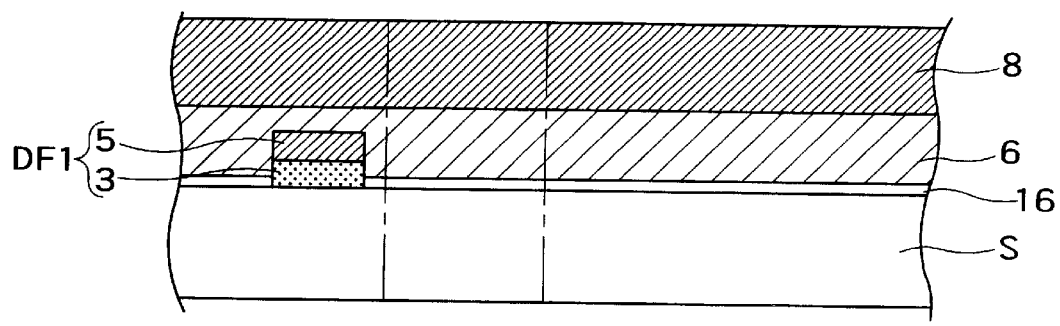
Figure 6:
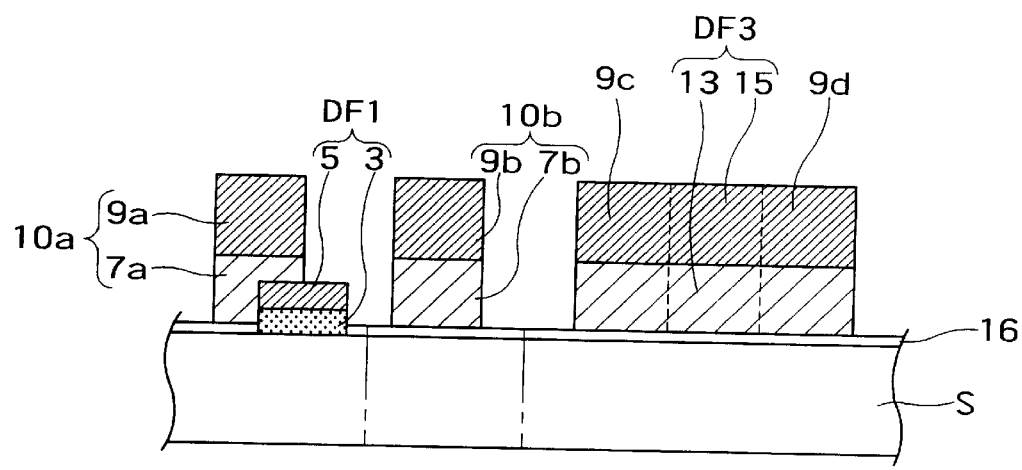
Figure 7:
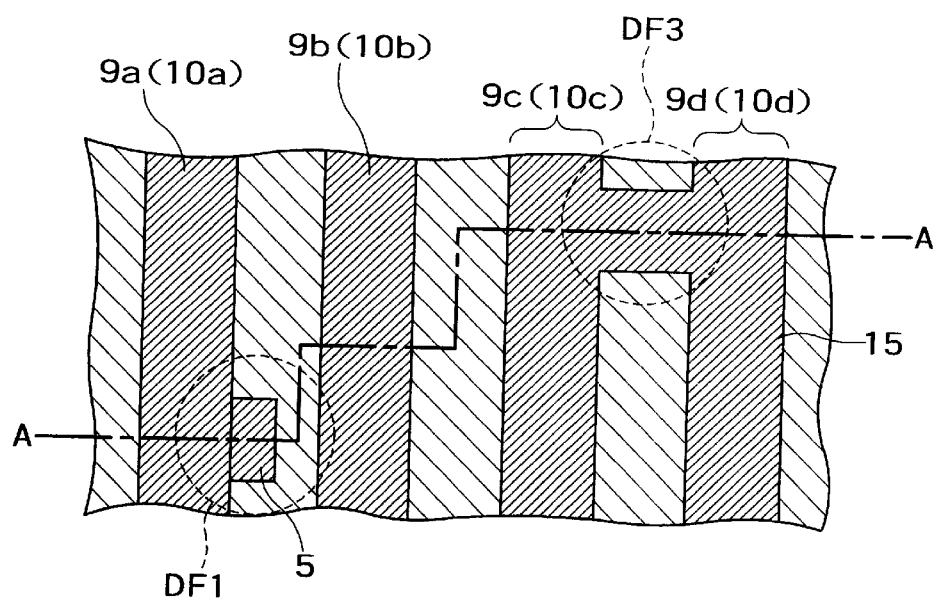

FIGS. 3 through 6 and FIGS. 8 through 11 are schematic sectional views for explaining a method for producing the simulated defective wafer shown in FIG. 1, and FIG. 7 is a schematic plan view for explaining a method for producing the simulated defective wafer shown in FIG. 1.

Figure 3:
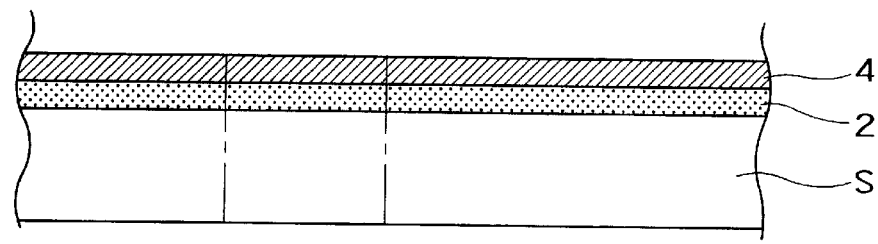
FIGS. 3 through 11 are schematic sectional views for explaining a method for preparing the simulated defective wafer shown in FIG. 1.

First, as shown in FIG. 3, after a silicon oxide film 2 is deposited on a silicon substrate S so as to have a thickness of about 50 nm, a silicon nitride film 4 is deposited thereon so as to have a thickness of about 100 nm.

Figure 4:
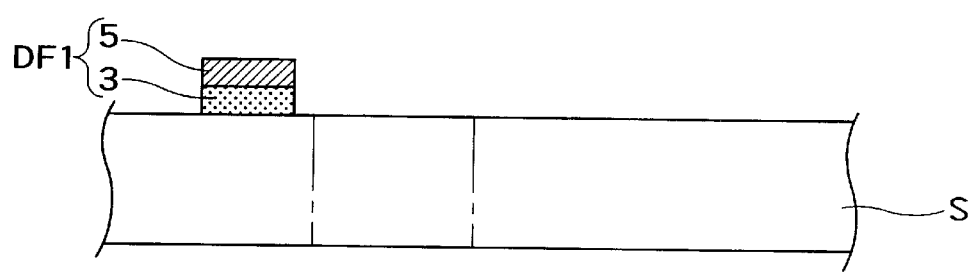

Then, as shown in FIG. 4, the silicon oxide film 2 and the silicon nitride film 4 are selectively removed by a patterning using a resist to form a silicon oxide film 3 and silicon nitride film 5 which constitute a simulated defect layer DF1 having the top face whose height will be different from that of the interconnection 10a.

Next, as shown in FIG. 5, after a silicon oxide film 16 is deposited on the surface of the substrate S so as to have a thickness of about 10 nm, a polysilicon film 6 and a silicon nitride film 8 are sequentially deposited on the whole surface so as to have a thickness of about 200 nm, respectively. The polysilicon film 6 and the silicon nitride film 8 are then selectively removed by a patterning using a resist to form interconnections 10a through 10d as shown in FIG. 6. At this time, the polysilicon film 6 and the silicon nitride film 8 are formed so as to have shapes shown by reference numbers 7a, 7b, 7c, 13 and 7d, and reference numbers 9a, 9b, 9c, 15 and 9d in FIG. 6, respectively, by using a resist pattern (mask) wherein the pattern for the defect layer is added to those of the interconnections. Thus, as shown in the plan view of FIG. 7, a simulated defect layer DF3 serving as a defect layer having an abnormal shape is formed simultaneously with the formation of the interconnections 10a through 10d.

Figure 8:
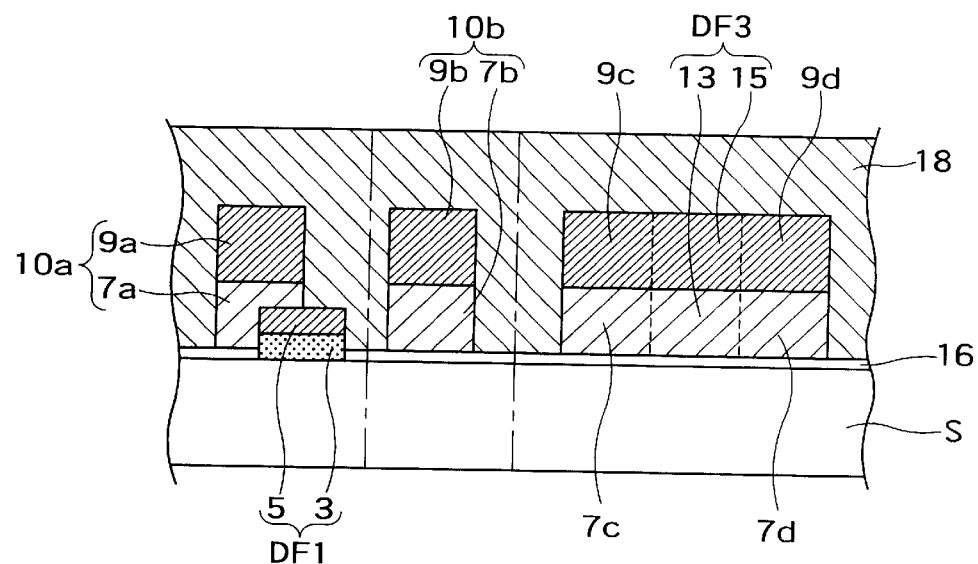
Figure 9:
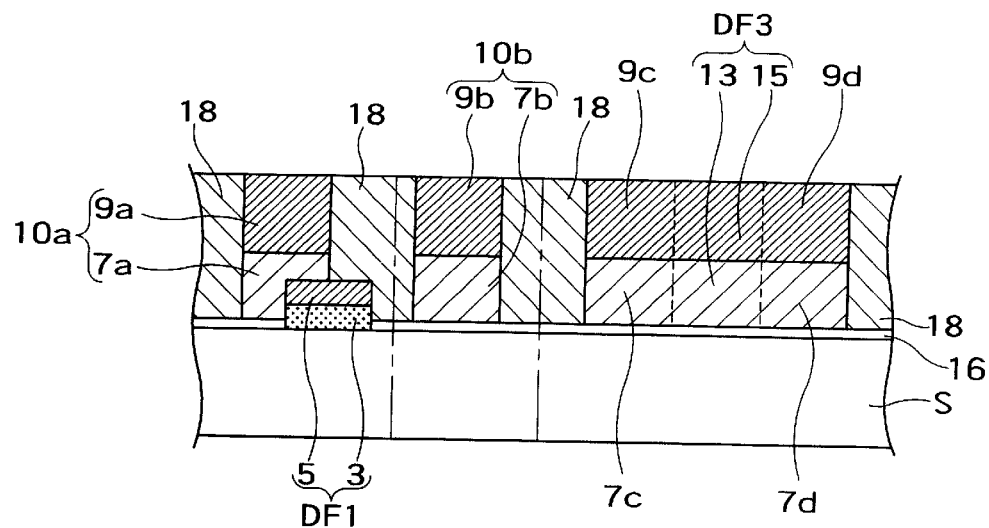

Then, after a BPSG (Boron-doped Phosphor-Silicate Glass) film 18 is deposited on the whole surface so as to have a thickness of about 800 nm as shown in FIG. 8, the BPSG film 18 is backed by the CPM (Chemical Mechanical Polishing) process until the silicon nitride films 9a, 9b, 9c, 15 and 9d are exposed as shown in FIG. 9.

Figure 10:
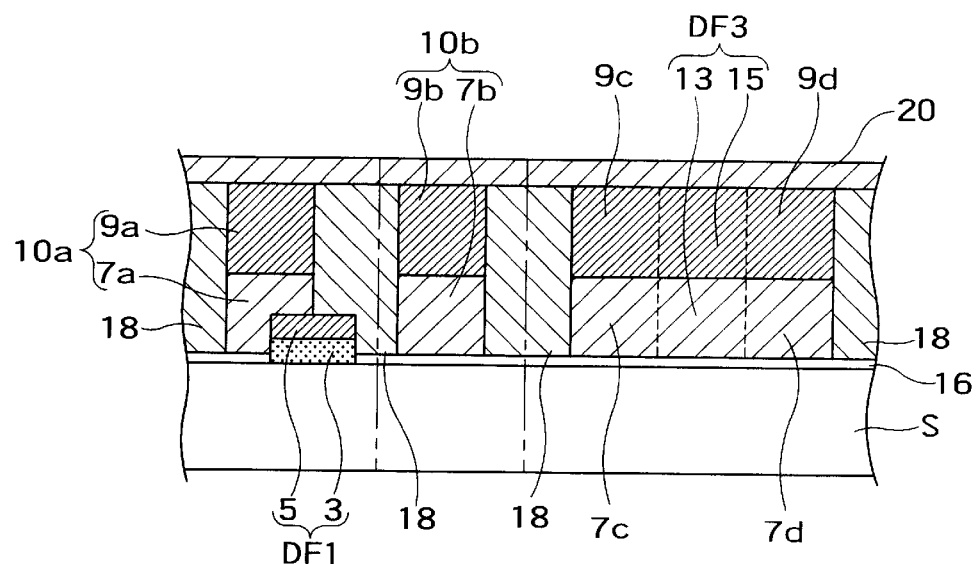
Figure 11:
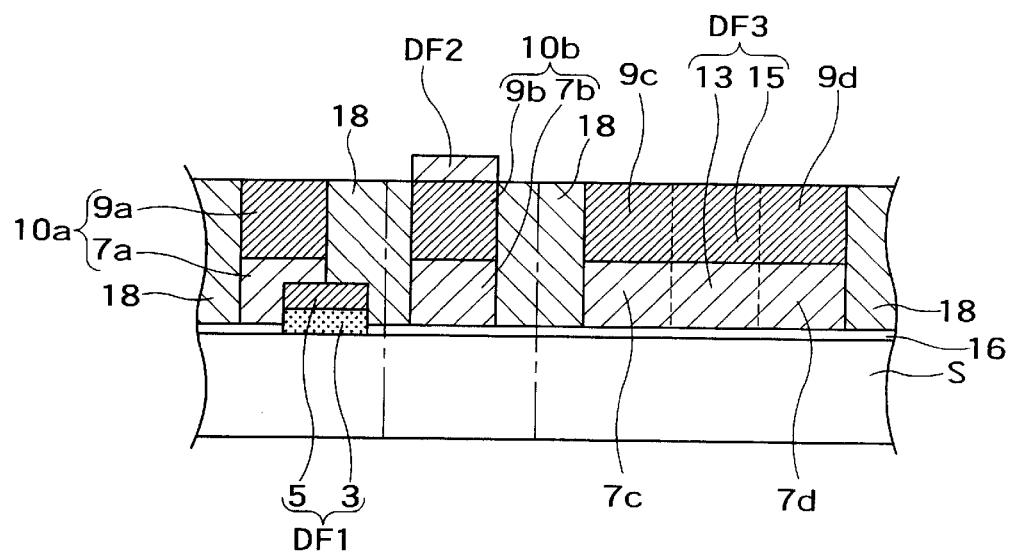

Then, after a polysilicon film 20 is deposited on the whole surface so as to have a thickness of about 100 nm as shown in FIG. 10, the polysilicon film 20 is selectively removed by a patterning using a resist as shown in FIG. 11. Thus, a simulated defect layer DF2 is formed on the interconnection 10b.

Finally, the BPSF film 18 is removed by the anisotropic etching to complete a simulated defective wafer 1 in a Gate wiring process as shown in FIGS. 1 and 2.

(2) Preferred Embodiment Of Pattern Defect Inspection Recipe Preparing Method

Figure 12:
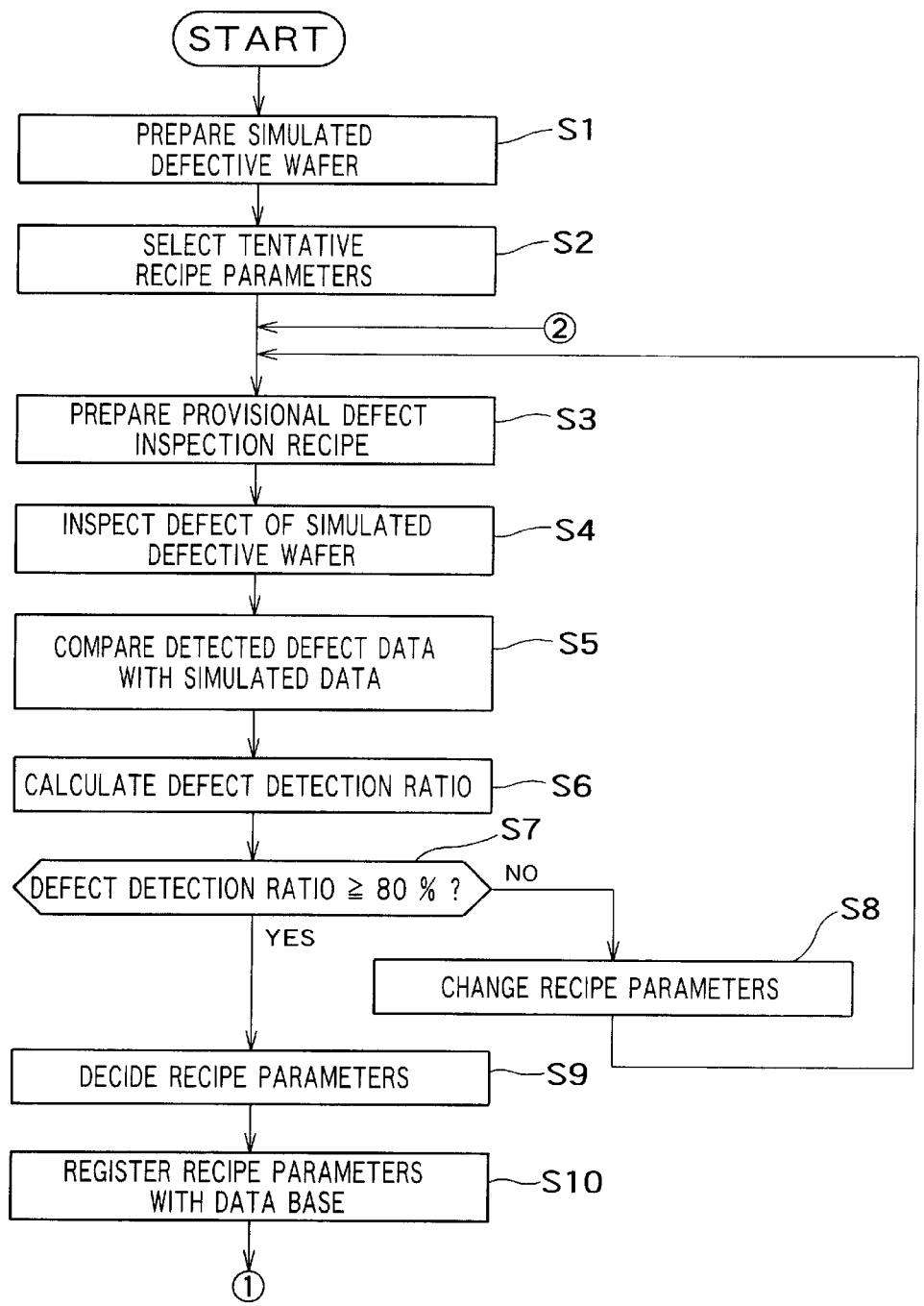
FIGS. 12 and 13 are flow charts for explaining a preferred embodiment of a pattern defect inspection recipe preparing method according to the present invention.
Figure 13:
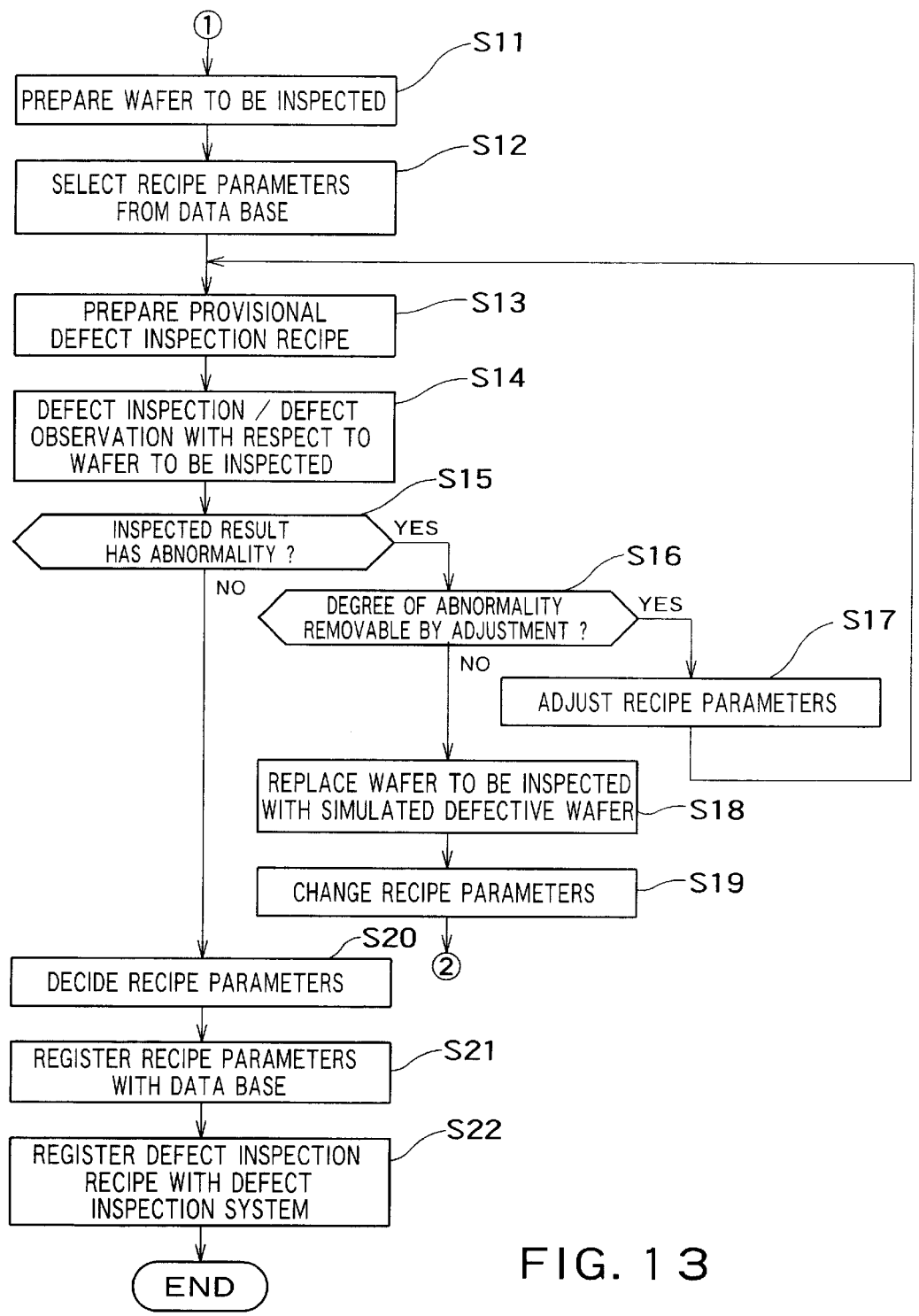
Figure 14:
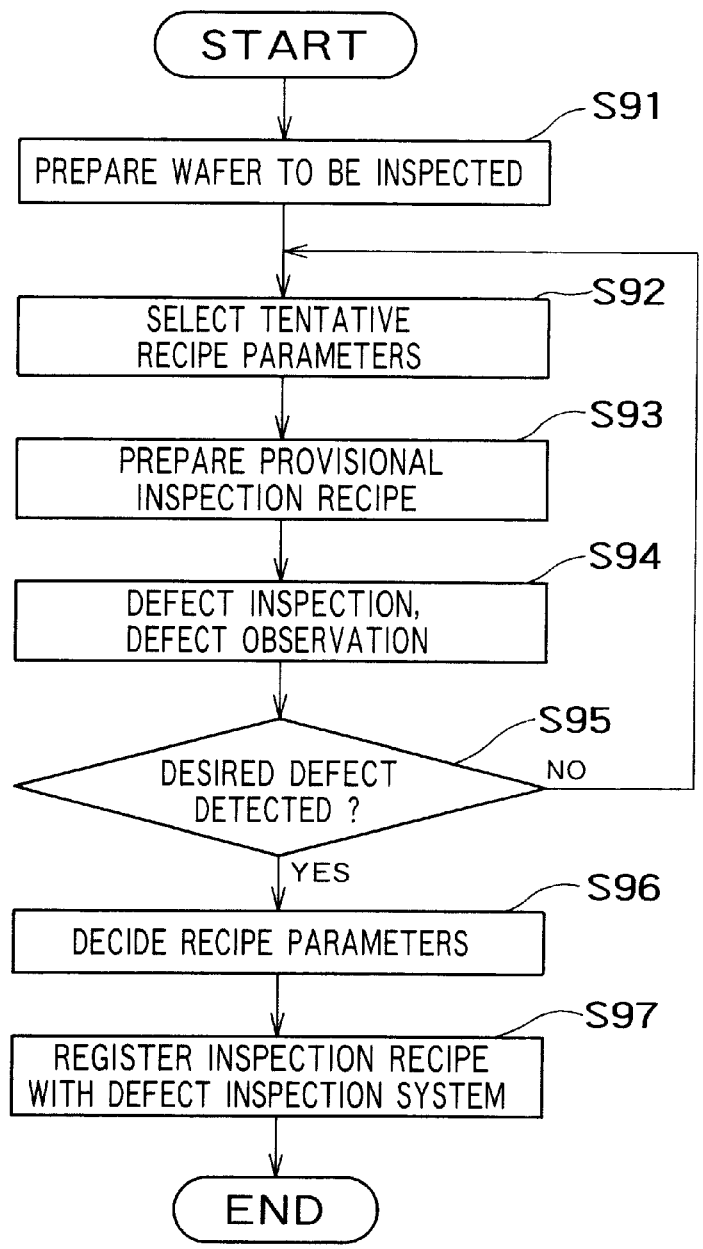
FIG. 14 is a flow chart for explaining a conventional pattern defect inspection recipe preparing method.
Figure 15:
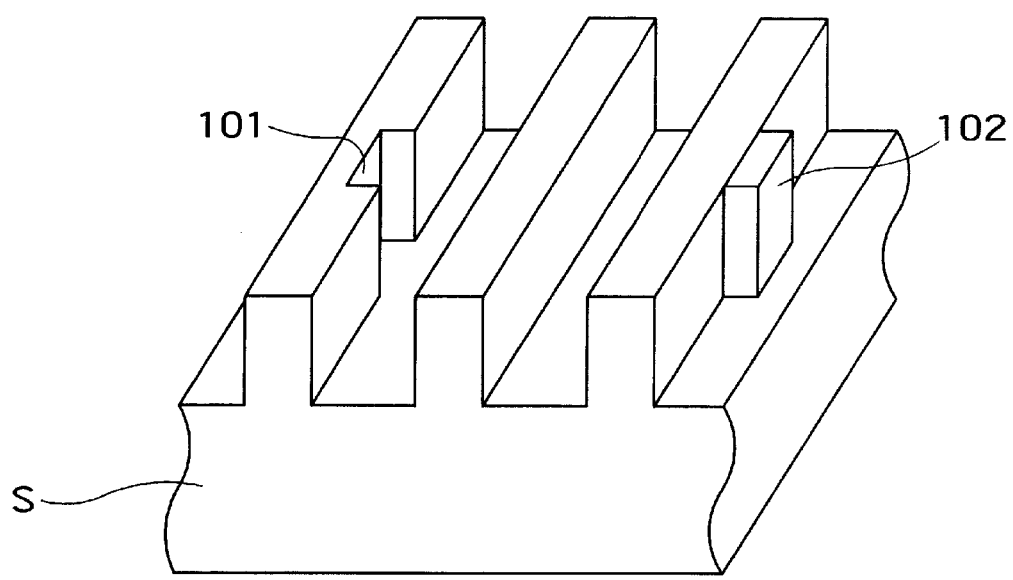
FIG. 15 is a local perspective view showing an example of a conventional simulated defective wafer.
Figure 16:
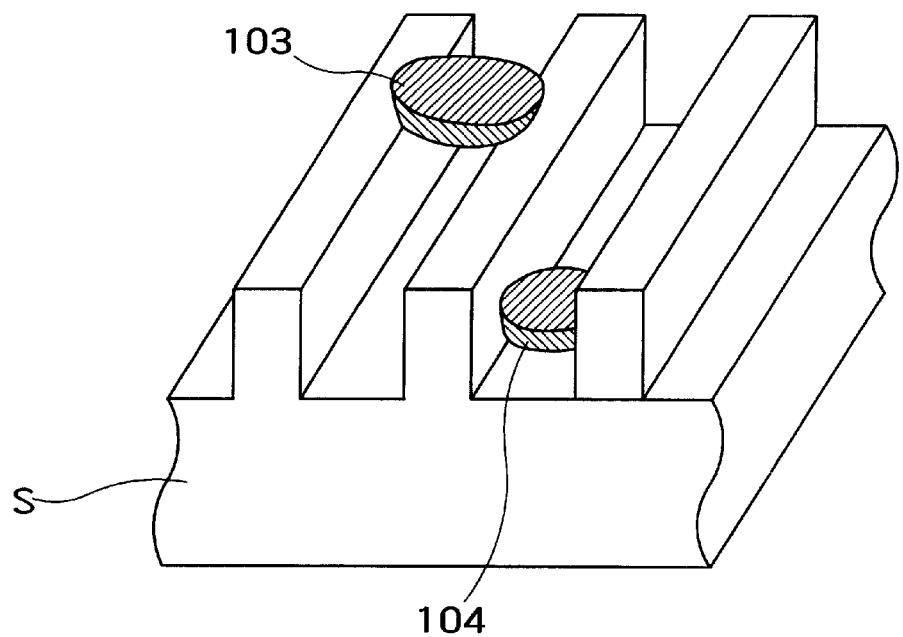
FIG. 16 is a local perspective view showing an example of a defective wafer for explaining problems in the prior art.

FIGS. 12 and 13 are flow charts for explaining a preferred embodiment of a defect inspection recipe preparing method according to the present invention. Furthermore, a defect inspection system to which a recipe prepared in this preferred embodiment is adapted should not particularly be limited. For example, the recipe may be applied to a defect inspection system with an optical system using laser beams or a defect inspection system with a charged beam system using electron beams.

First, as shown in FIG. 12, a simulated defective wafer 1 (see FIGS. 1 and 2) is prepared together with its simulated defect data (step S1), and tentative recipe parameters are selected (step S2) to prepare a provisional defect inspection recipe (step S3). The recipe parameters include many parameters according to the kinds of an inspection process and an object to be inspected. For example, the recipe parameters include a focal length in an optical system (or an electronic optical system), the size of a picture element (pixel) constituting an image of a defect to be acquired and the density of an image filter for removing noises.

Then, the prepared provisional defect inspection recipe is used for carrying out a defect inspection for the simulated defective wafer 1 to detect simulated defects (step S4).

Then, a defect data detected by the provisional defect inspection recipe is compared with a previously prepared simulated defect data (step S5) to calculate a defect detection ratio (step S6).

Then, the defect detection ratio thus obtained is compared with a desired detection ratio (step S7). In this preferred embodiment, the desired detection ratio is set as 80%.

If the obtained defect detection ratio does not satisfy a criterion (step S7), while the values of the tentative recipe parameters are changed (step S8), the above described steps S3 through S7 are repeated until recipe parameters satisfying the criterion are found. On the other hand, if the obtained defect detection ratio satisfies the criterion, the recipe parameters at that time are assumed as parameters which are likely to be adaptive for the defect inspection recipe (step S9) and the decided parameters are registered with a data base (step S10).

Then, as shown in FIG. 13, a wafer serving as an object to be actually inspected is prepared (step S11), recipe parameters assumed to be suited to the wafer serving as the object to be inspected are selectively derived from the data base among the recipe parameters which have been registered with the data base at the above described step S10 (step S12) and a provisional defect inspection recipe is to prepared again (step S13).

Then, the defect inspection and defect observation are actually carried out with respect to the wafer serving as the object to be inspected, which has been prepared at the above described step S11 (step S14), to confirm whether the inspected results have an abnormality (step S15). The abnormality in the inspected results is typically a noise. For example, in the case of a defect inspection system with an optical system, the abnormality is typically a noise in the light intensity profile of light reflected on the wafer, and in the case of a defect inspection system with a charged beam system, the abnormality is in general a noise in the concentration profile of an electron beam image formed by secondary electrons or the like detected from the wafer. If an abnormality is found in the inspected results (step S15), the assumed recipe parameters are reviewed in accordance with the degree of the abnormality. If the degree of the abnormality is minor and if the abnormality can be removed by adjustment (step S16), the values of the recipe parameters are adjusted (step S17) to prepare a provisional defect inspection recipe again, and the same wafer serving as an object to be inspected is used for repeating confirmation step until no abnormality is found (steps S13 through S15). If the degree of the abnormality is remarkable and if it seems difficult to remove the abnormality by adjustment (step S16), a simulated defective wafer 1 is prepared again to be substituted for the wafer serving as the object to be inspected (step S18), and the recipe parameters are changed (step S19). Then, the above described steps S3 through S17 are repeated until the abnormality disappears. If no abnormality is found in the inspected results or if it is confirmed that no abnormality exists after the above described series of processes (step S15), the recipe parameters at that time are decided as final recipe parameters (step S20).

Thereafter, the final recipe parameters are registered with the data base (step S21). Moreover, the provisional inspection recipe at that time is determined as an inspection recipe to be registered with the defect inspection system (step S22) to complete the preparation of a defect inspection recipe.

According to this preferred embodiment, the simulated defective wafer 1 having the simulated defect layer which has the variations in height and plane shape with respect to the simulated normal layer is used, and the detection sensitivity of the provisional recipe is quantified by comparing the pattern defect data detected by the provisional recipe with the simulated defect data of the simulated defective wafer 1, so that it is possible to prepare a recipe file capable of detecting all of desired defect kinds independent of the level of skill of a person who prepares the recipe. In addition, the wafer serving the object to be inspected is used for actually carrying out the defect inspection to verify the presence of abnormalities such as noises, so that it is possible to prepare the optimum recipe file.

While the recipe file for detecting all of desired defect kinds has been prepared in the defect inspection recipe preparing method in the above described preferred embodiment, there are some cases where it has only to detect the presence of specific defect kinds, such as those positioned at a predetermined height from the surface of the substrate, in a semiconductor fabricating process. In such cases, it is required only to process recipe parameters according to desired defect kinds when carrying out the selection, adjustment and change of recipe parameters (steps S2 and S8 of FIG. 12, S12, S17 and S19 of FIG. 13) among the series of processes in the above described preferred embodiment. Thus, it is possible to prepare a defect inspection recipe capable of greatly enhancing the efficiency of defect inspection.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention according to the appended claims.

What is claimed is:

1. A simulated defective wafer comprising:
 a simulated normal layer formed on a semiconductor substrate and configured such that a top face of said simulated normal layer is at a first height from a surface of the semiconductor substrate; and
 a first simulated defect layer formed on said semiconductor substrate and configured such that a top face of said first simulated defect layer is at a second height, different from said first height, from the surface of the semiconductor substrate.

2. A simulated defective wafer according to claim 1, wherein said first simulated defect layer comprises a layer formed on said simulated normal layer.

3. A simulated defective wafer according to claim 1, further comprising:

a second simulated defect layer formed on the semiconductor substrate and comprising a simulated plane shape different from a plane shape of said simulated normal layer.

4. A simulated defective wafer according to claim 3, wherein said first simulated defect layer comprises a layer formed on said simulated normal layer.

5. A method for preparing a defect inspection recipe for use in a semiconductor defect inspection system, comprising:

setting a tentative recipe parameter;

preparing a first provisional pattern defect inspection recipe on a basis of said recipe parameter;

detecting a defect of a simulated defective wafer by using said first provisional pattern defect inspection recipe; and obtaining simulated defect data comprising data on a defect kind from said simulated defective wafer;

calculating a defect detection ratio of said first provisional pattern defect inspection recipe by comparing detected defect data from said detecting step with said simulated defect data;

determining a pattern defect detection sensitivity of said first provisional pattern defect inspection recipe by comparing a calculated pattern defect detection ratio with a desired pattern defect detection ratio;

repeating said preparing step through said determining step until a desired defect detection sensitivity is obtained while changing said tentative recipe parameter when the calculated defect detection ratio is lower than said desired defect detection ratio; and deciding an adaptive recipe parameter for said semiconductor defect inspection system at a time when said desired defect detection sensitivity is obtained.

6. A defect inspection recipe preparing method according to claim 5, wherein said detecting comprises:

detecting a defect on a simulated defective wafer including, a simulated normal layer formed on a semiconductor substrate and configured such that a top face of said simulated normal layer is at a first height from a surface of the semiconductor substrate, and a first simulated defect layer formed on said semiconductor substrate and configured such that a top face of said first simulated defect layer is at a second height, different from said first height, from the surface of the semiconductor substrate.

7. A defect inspection recipe preparing method according to claim 6, wherein said first simulated defect layer comprises a layer formed on said simulated normal layer.

8. A defect inspection recipe preparing method according to claim 6, wherein said simulated defective wafer further comprises:

a second simulated defect layer formed on the semiconductor substrate and comprising a simulated plane shape different from a plane shape of said simulated normal layer.

9. A defect inspection recipe preparing method according to claim 8, wherein said first simulated defect layer comprises a layer formed on said simulated normal layer.

10. A defect inspection recipe preparing method according to claim 6, further comprising:

changing a focal length of at least one of the optical system and an electron optical system; and setting said focal length corresponding to said defect kind which exists at a predetermined position in directions perpendicular to the surface of the semiconductor wafer.

11. A defect inspection recipe preparing method according to claim 5, further comprising:

preparing a second provisional defect inspection recipe using said adaptive recipe parameter;

inspecting for an actual defect of a semiconductor wafer using said second provisional defect inspection recipe;

verifying whether a result of said inspecting includes an abnormality; and repeating said preparing a second provisional defect step through said verifying step until said abnormality disappears while adjusting said adaptive recipe parameter when said result of said inspecting includes the abnormality.

12. A defect inspection recipe preparing method according to claim 11, wherein said detecting comprises:

detecting a defect on a simulated defective wafer including, a simulated normal layer formed on a semiconductor substrate and configured such that a top face of said simulated normal layer is at a first height from a surface of the semiconductor substrate, and a first simulated defect layer formed on said semiconductor substrate and configured such that a top face of said first simulated defect layer is at a second height, different from said first height, from the surface of the semiconductor substrate.

13. A defect inspection recipe preparing method according to claim 12, wherein said first simulated defect layer of said simulated defective wafer comprises a layer formed on said simulated normal layer.

14. A defect inspection recipe preparing method according to claim 12, wherein said simulated defective wafer further comprises a second simulated defect layer formed on the semiconductor substrate and includes a simulated plane shape different from a plane shape of said simulated normal layer.

15. A defect inspection recipe preparing method according to claim 14, wherein said first simulated defect layer of said simulated defective wafer comprises a layer formed on said simulated normal layer.

16. A defect inspection recipe preparing method according to claim 5, further comprising:

preparing a second provisional defect inspection recipe using said adaptive recipe parameter;

inspecting for an actual defect of a semiconductor wafer using said second provisional defect inspection recipe;

verifying whether a result of said inspecting includes an abnormality;

determining a degree of the abnormality when said result of said inspecting includes the abnormality;

classifying said degree of the abnormality to a first case where said degree of said abnormality is within a range in which said abnormality is removable by adjusting said second provisional defect inspection recipe and to a second case where said degree of said abnormality is beyond a range in which said abnormality is removable by adjusting said second provisional defect inspection recipe; and modifying said second provisional recipe in accordance with a result of said classifying, wherein, in the first case, said preparing a second provisional recipe step through said verifying step are repeated while adjusting said adaptive recipe parameter until said abnormality disappears, and in the second case, said preparing a first provisional recipe step through said verifying step are repeated while changing said tentative recipe parameter and said adaptive recipe parameter until said abnormality disappears.

17. A defect inspection recipe preparing method according to claim 16, wherein said detecting comprises:
- detecting a defect on a simulated defective wafer including,
- a simulated normal layer formed on a semiconductor substrate and configured such that a top face of said simulated normal layer is at a first height from a surface of the semiconductor substrate, and
- a first simulated defect layer formed on said semiconductor substrate and configured such that a top face of said first simulated defect layer is at a second height, different from said first height, from the surface of the semiconductor substrate.

18. A defect inspection recipe preparing method according to claim 17, wherein said first simulated defect layer of said simulated defective wafer comprises a layer formed on said simulated normal layer.

19. A defect inspection recipe preparing method according to claim 17, wherein said simulated defective wafer further comprises a second simulated defect layer formed on the semiconductor substrate and including a simulated plane shape different from a plane shape of said simulated normal layer.

20. A defect inspection recipe preparing method according to claim 19, wherein said first simulated defect layer of said simulated defective wafer comprises a layer formed on said simulated normal layer.

* * * * *